United States Patent
Matsuya et al.

(10) Patent No.: US 6,930,312 B2
(45) Date of Patent: Aug. 16, 2005

(54) CHARGED-PARTICLE BEAM INSTRUMENT AND METHOD OF CORRECTING ABERRATION THEREIN

(75) Inventors: Miyuki Matsuya, Tokyo (JP); Shinobu Uno, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/861,775

(22) Filed: Jun. 4, 2004

(65) Prior Publication Data

US 2005/0017194 A1 Jan. 27, 2005

(30) Foreign Application Priority Data

Jun. 6, 2003 (JP) ........................... 2003-162527

(51) Int. Cl.$^7$ .................................. H01J 37/14
(52) U.S. Cl. ...................... 250/396 R; 250/398
(58) Field of Search ..................... 250/396 R, 398, 250/396 ML, 310

(56) References Cited

U.S. PATENT DOCUMENTS 6,723,997 B2 * 4/2004 Matsuya et al. ........ 250/396 R

OTHER PUBLICATIONS

Von H. Rose, "Abbildungseigenschaften sphärisch korrigierter elektronenoptischer Achromate" (Properties of Spherically Corrected Achromatic Electron–Lenses), *Optic 33*, Heft 1, 1971, pp. 1–24.

M. Haider, W. Bernhardt, and H. Rose, "Design and test of an electric and magnetic dodecapole lens", *Optic 63*, No. 1, 1982, pp. 9–23.

J. Zach, "Design of a high–resolution low–voltage scanning electron microscope", *Optic 83*, No. 1, 1989, pp. 30–40.

Joachim Zach, Maximilian Haider, "Aberration correction in a low voltage SEM by a multipole corrector", *Nuclear instruments and Methods in Physics Research*, A 363, 1995, pp. 316–325.

* cited by examiner

Primary Examiner—Kiet T. Nguyen
(74) *Attorney, Agent, or Firm*—The Webb Law Firm (57) ABSTRACT

An aberration correction method and charged-particle beam instrument with four stages of multipole units. The two central stages of multipole units function as two stages of magnetic quadrupole components for superimposing a magnetic potential distribution analogous with an applied electric potential distribution on this electric potential distribution. The instrument further includes an objective lens, an objective aperture mounted in the optical path for a beam of charged particles, an operation portion for varying the accelerating voltage or the working distance between the objective lens and a specimen, and a control portion for controlling the multipole units according to an operation of the operation portion. When the accelerating voltage or working distance is varied, the resultant magnification of the four stages of multipole units and objective lens mounted behind the units is adjusted to maintain constant at least one of octupole component-activating potentials for correcting third-order aperture aberrations.

14 Claims, 7 Drawing Sheets

CHARGED-PARTICLE BEAM INSTRUMENT AND METHOD OF CORRECTING ABERRATION THEREIN

BACKGROUND OF THE INVENTION

1. Field of the Invention

The present invention relates to a method of correcting chromatic and spherical aberrations in a charged-particle beam instrument, such as an electron beam instrument (e.g., a scanning electron microscope) or an ion beam instrument (e.g., an ion microprobe). The invention also relates to such a charged-particle beam instrument.

2. Description of Related Art

The following non-patent references appear to be relevant to the present invention: (1) H. Rose, *Optik* 33, Heft 1, pages 1–24 (1971); (2) J. Zach, *Optik* 83, No. 1, pages 30–40 (1989); (3) J. Zach and M. Haider, *Nucl. Instr. and Meth. In Phys. Res.* A 363, pages 316–325 (1995); and (4) M. Haider et al., *Optik* 63, No. 1, pages 9–23 (1982).

In scanning electron microscopes and transmission electron microscopes, an aberration corrector is incorporated in the electron optics in order to achieve high-resolution imaging or enhance the probe current density. In a proposed system, this aberration corrector is fitted with multipole units each having twelve pole elements. Chromatic aberration is corrected by a combination of an electrostatic quadrupole operation mode and a magnetic quadrupole operation mode. Spherical aberration is corrected by an octupole operation mode using three or four stages. The principle is introduced in detail in the above-cited references 1–3.

The principle of the above-described aberration corrector is briefly described with reference to FIG. 1, where the aberration corrector, indicated by C, is disposed ahead of an objective lens 7. The corrector C has four stages of multipole units 51, 52, 53, and 54 each having twelve pole elements. Electric potentials 1', 2', 3', and 4' for activating the electrostatic quadrupole components are applied to the multipole units 51, 52, 53, and 54, respectively. Electric currents 5' and 6' for activating magnetic quadrupole components are applied to the second and third stages of multipole elements 52 and 53, respectively, to produce a magnetic potential distribution analogous with the electric potential distribution produced by the electrostatic quadrupole component-activating electric potentials 2 and 3 and to produce magnetic fields superimposed with electric fields. Thus, magnetic fields superimposed with the electric fields are set up. Furthermore, electrostatic octupole component-activating electric potentials 11', 12', 13', and 14' are applied to the multipole units 51, 52, 53, and 54, respectively, to produce electric fields superimposed with the electric fields developed by the quadrupole element-activating electric potentials 1', 2', 3', 4'.

In actual instrumentation, electric potentials (acting as a deflector for axial alignment) for activating dipole elements and electric potentials (acting to correct second-order aperture aberrations) for activating hexapole elements are superimposed on the above-described electric fields produced by the potentials for activating the quadrupole components and octupole components. Since dipole and hexapole potentials are minimally directly associated with aberration correction for which the present invention is intended, their detail description is omitted.

Figure 1:
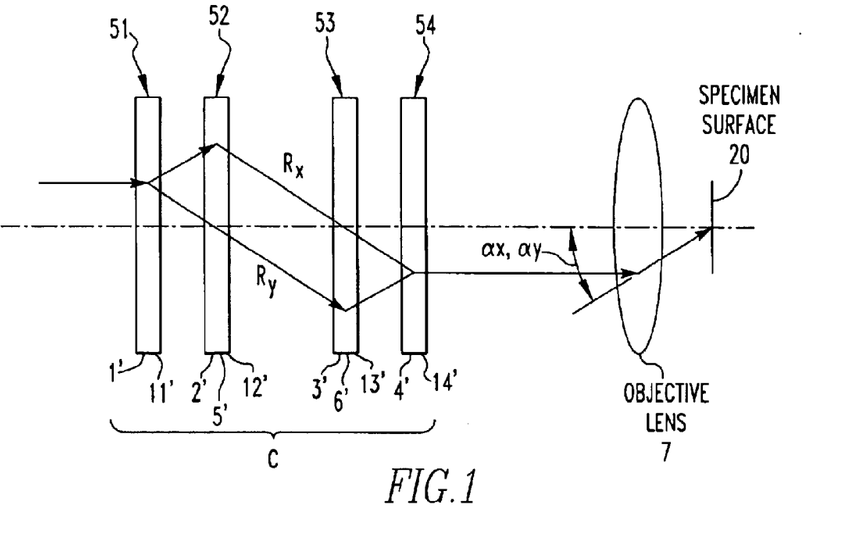
FIG. 1 is a schematic diagram illustrating the principle of an aberration correction system.

In the configuration of FIG. 1, a beam of charged particles enters from the left side as viewed in the figure. The four stages of multipole units 51, 52, 53, 54 and the objective lens 7 create a reference orbit for the beam. This beam is brought to a focus on a specimen surface 20. In FIG. 1, orbits $R_x$ and $R_y$ in the X- and Y-directions, respectively, of the beam of particles are both drawn schematically on the same plane.

The reference orbit can be understood as follows. As a paraxial orbit that can be taken as an orbit in a case where there is no aberration, the orbit $R_y$ in the Y-direction is caused to pass through the center of the multipole unit 52 by the multipole unit 51. The orbit $R_x$ in the X-direction is made to pass through the center of the multipole unit 53 by the multipole unit 52. Finally, the beam of charged particles is brought to a focus on the specimen surface by the multipole units 53 and 54 and by the objective lens 7. The electric potentials 1', 2', 3', and 4' for activating electrostatic quadrupole components are applied to the multipole units 51, 52, 53, and 54, respectively. In practice, these need to be adjusted mutually for complete focusing. At this time, the aforementioned dipole element-activating potentials are used for axial alignment.

Referring more particularly to FIG. 1, the beam of charged particles in the orbit $R_x$ in the X-direction is defocused by the multipole unit 51 acting like a concave lens. Then, the beam is focused by the multipole unit 52 acting like a convex lens so that the beam passes through the center of the multipole unit 53. Then, the beam is focused by the multipole unit 54 and directed toward the objective lens 7. Meanwhile, the beam of charged particles in the orbit $R_y$ in the Y-direction is focused by the multipole unit 51 and made to pass through the center of the multipole unit 52. Then, the beam is focused by the multipole unit 53. Finally, it is defocused by the multipole unit 54 and directed toward the objective lens 7. In this way, the defocusing action of the multipole unit 51 acting on the X-direction orbit $R_x$ and the defocusing action of the multipole unit 54 acting on the Y-direction orbit $R_y$ are combined. The resulting action can act like a single concave or convex lens.

Chromatic aberration correction made by the aberration corrector C is now described. To correct chromatic aberration by the system shown in FIG. 1, the potential $\phi_{q2}$ [V] for activating electrostatic quadrupole components and the magnetic excitation $J_2$ [AT] (or magnetic potential) for activating magnetic quadrupole components are adjusted such that the reference orbit is not affected. The whole lens system acts to correct the X-direction chromatic aberration to zero. Similarly, the potential $\phi_{q3}$ [V] for activating electrostatic quadrupole components and the magnetic excitation $J_3$ [AT] for activating magnetic quadrupole components are adjusted such that the reference orbit is not affected. The whole lens system acts to correct the Y-direction chromatic aberration to zero.

Correction of spherical aberration (correction of the third-order aperture aberrations) is next described. Where spherical aberration is corrected, X- and Y-direction chromatic aberrations are corrected. Then, the X-direction spherical aberration in the whole lens system is corrected to zero by the potential $\phi_{o2}$ [V] for activating electrostatic octupole components. The Y-direction spherical aberration is corrected to zero by the potential $\phi_{o3}$ [] for activating electrostatic octupole components.

Then, the spherical aberration in the combined direction of the X- and Y-directions is corrected to zero by the electrostatic octupole component-activating potentials 11 and/or 14. In practice, repeated mutual adjustments are necessary. With respect to superimposition of the potentials and magnetic excitations at quadrupole and octupole components, the potential or excitation applied to each pole of a single dodecapole (twelve-pole) element is varied to synthesize dipole, quadrupole, hexapole, octupole, etc. This method has been put into practical use and introduced, for example, in the above-cited reference 4.

Figure 2:
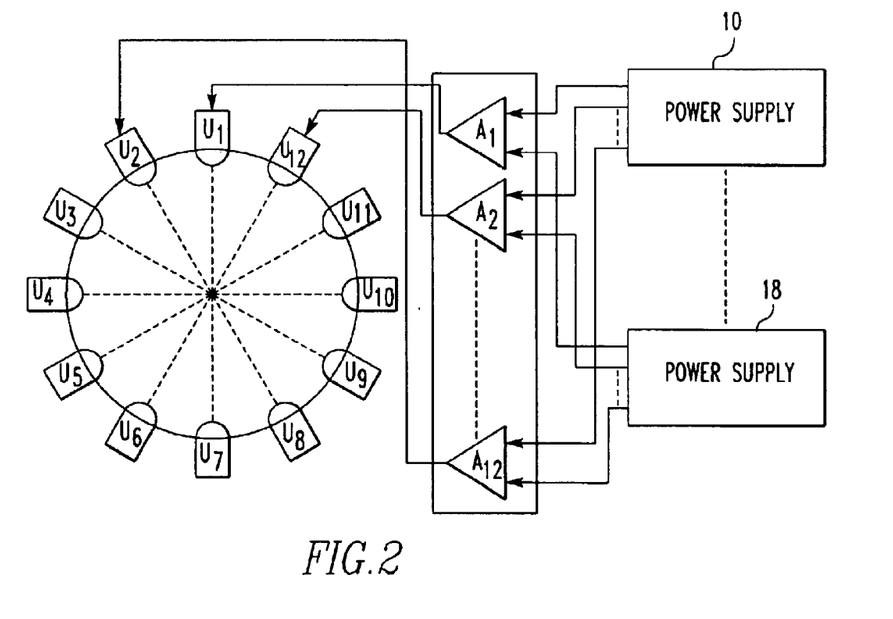
FIG. 2 is a diagram illustrating a method of using an electrostatic dodecapole element as an electrostatic multipole element having less than twelve poles.

In particular, in an electrostatic design, a final stage of power supplies $A_n$ (n=1, 2, . . . 12) capable of supplying voltages to twelve electrodes $U_n$ (n=1, 2, . . . , 12) independently is connected as shown in FIG. 2. Where a quadrupole field is produced, the output voltages from a quadrupole power supply 10 are supplied to the final-stage power supplies $A_n$ to obtain a field close to an ideal quadrupole field. If it is assumed that the output voltages from the final-stage power supplies $A_n$ are proportional to the output voltages from the quadrupole power supply 10, the ratio of the output voltages from the quadrupole power supply 10 assumes a value as given in the above-cited reference 4 above. Where an octupole field is created to be superimposed on this quadrupole field, the output voltages from an octupole power supply 18 are added to the output voltages from the quadrupole power supply 10 and supplied to the final-stage power supplies $A_n$ to obtain a field close to an ideal octupole field. Similarly, a field on which a multipole field produced by a 2n-pole element (n=1, 2, . . . , 6) is superimposed is obtained using the single dodecapole element.

Figure 3:
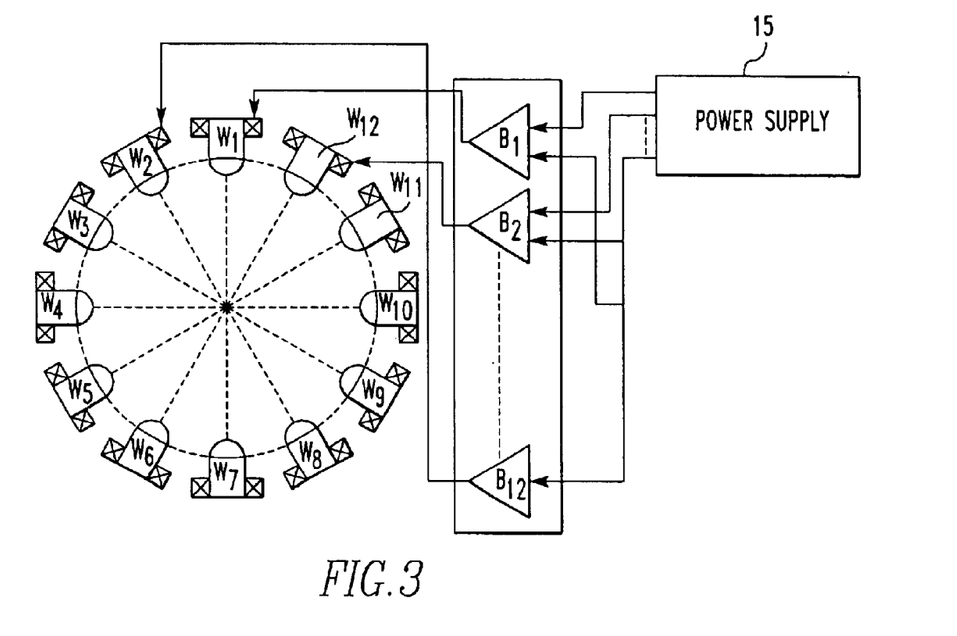
FIG. 3 is a diagram illustrating a method of using a magnetic dodecapole element as a magnetic multipole element having less than twelve poles and depicting the fundamental structure of the present invention.

In a magnetic design, a final stage of power supplies $B_n$ (n=1, 2, . . . , 12) capable of supplying excitation currents to the coils on twelve magnets $W_n$ (n=1, 2, . . . , 12) independently is connected as shown in FIG. 3. Where a quadrupole magnetic field is created, the output voltages from a quadrupole magnetic-field power supply 15 are supplied to the power supplies $B_n$ to produce a field close to an ideal quadrupole magnetic field. If it is assumed that the output currents from the final-stage power supplies $B_n$ are proportional to the output voltages from the quadrupole magnetic-field power supply 15, the ratio of the output voltages from the power supply 15 assumes a magnetic excitation ratio as given in the above-cited reference 4 above. Superimposition of multipole fields other than a quadrupole magnetic field is not explained herein. However, a multipole magnetic field can be superimposed in the same way as in the electrostatic design, by adding voltages for the multipole field to the input voltages to the final-stage power supplies $B_n$. A yoke for magnetically connecting the outside portions of the magnets $W_n$ is omitted in FIG. 3.

Where electrostatic and magnetic designs are superimposed, a conductive magnetic material may be used so that the magnets $W_n$ can act also as the electrodes $U_n$. In this case, the coils on the magnets are positioned to be electrically isolated from the electrodes.

In the description given below, the 2n-pole elements are treated as if they were stacked on top of each other to simplify the explanation. In practice, superimposition of multipole fields on a single dodecapole element is achieved by adding voltage signals as mentioned previously.

After the end of correction of chromatic aberration, it may be necessary to correct the second-order aperture aberration by means of three or four stages of hexapole elements before correction of spherical aberration is performed. This correction is made in the same procedure as in the aforementioned correction of spherical aberration. This second-order aperture aberration occurs depending on the mechanical accuracy of the aberration corrector. Normally, the amount of correction is small, and this aberration affects higher-order aberrations only a little within the scope of the present aberration corrector. The second-order aperture aberration is corrected within the aberration corrector. So, if the resultant magnification (described later) of the aberration corrector and the objective lens is varied, higher-order aberrations are affected little, though the resultant magnification is important in aberration correction. For this reason, description of the correction of the second-order aperture aberration is omitted herein.

Figure 4A:
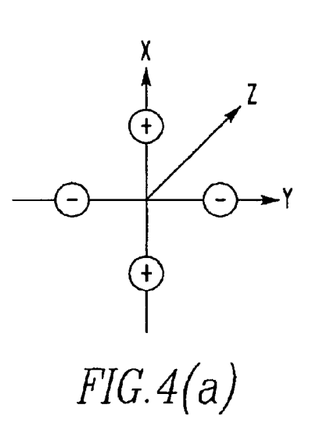
FIGS. 4(a) and 4(b) illustrate normal arrays of electrostatic multipole elements, illustrating the operating principle of the present invention.
Figure 4B:
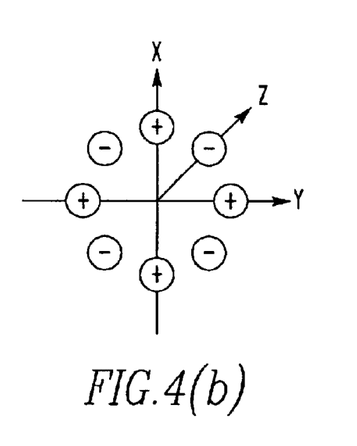

In the description given below, an electric potential φ (or a voltage) represents a plus-side value in a normal array of multipole elements shown in FIGS. 4(a) and 4(b). Similarly, a magnetic excitation J in magnetic multipole elements represents a plus-side value [AT].

The aforementioned theory of aberration correction and the results of actually performed experiments demonstrate that chromatic and spherical aberrations are almost completely corrected. This proves the excellence of the aberration correction system described above. From a point of view of practicability, however, it can be said that sufficient consideration has not been given to the stability of the aberration correction system and to the range of the applied voltage and even to the optimum conditions. For example, the following problems have arisen.

First, where an aberration-correcting electric potential proportional to the accelerating voltage is used as shown in the prior-art example, i.e., in a case where the aberration-correcting potential applied to each pole element is made to vary in proportion to the accelerating voltage of the electron beam, if the accelerating voltage is set to a lower value, the noise component of the voltage or current used in the aberration corrector produces a greater effect.

Secondly, where an aberration-correcting potential proportional to the accelerating voltage is used as in the prior art example, if a large correcting potential is used at low accelerating voltages to reduce the effect of the noise component of the current, the withstand voltage of the aberration corrector at high accelerating voltages presents problems.

Thirdly, where an aberration-correcting potential proportional to the accelerating voltage is used as in the prior art example, if the instrument is made immune to noise components at low accelerating voltages, it is necessary to reduce the amount of noise component of the voltage or current of the power supply to a practical value. If this is achieved, the instrument is expensive to make.

Fourthly, if the resultant magnification $M_R$ of the aberration corrector and objective lens is adjusted to maintain constant the excitation current through the magnetic quadrupole components for correcting chromatic aberration, the aberration-correcting potential is non-relativistically in proportion to the square root of the accelerating voltage. This alleviates the first through third problems described above. However, where the range of the variable accelerating voltage is wide, the spherical aberration-correcting potential becomes too large at low accelerating voltages. As a result, an expensive power supply may be necessary.

Fiftly, complex data for correcting spherical aberration has been necessary for each value of the accelerating voltage and for each value of the working distance.

SUMMARY OF THE INVENTION

It is an object of the present invention to provide a method of correcting aberrations in a charged-particle beam instrument stably and optimally in such a way that the instrument is less affected by noise, is free of the withstand voltage problem of the instrument at high accelerating voltages, and is free of the problem with corrective potentials at low accelerating voltages. It is another object to provide a charged-particle beam instrument.

A method of correcting aberrations in a charged-particle beam instrument in accordance with the present invention pertains to the charged-particle beam instrument having: an aberration corrector fitted with four stages of multipole units each having plural pole elements to which at least octupole component-activating potentials for correcting third-order aperture aberrations in a beam of charged particles are applied; an objective lens mounted on a rear side of the aberration corrector and acting to focus the accelerated beam of charged particles onto a specimen; a control portion for controlling the activation potentials applied to the pole elements of the stages of multipole units; and an operation portion for varying the accelerating voltage of the beam or the working distance between the objective lens and the specimen. Operating the control portion, the method further comprises the steps of: adjusting the resultant magnification of the aberration corrector and the objective lens when the accelerating voltage or working distance is varied by the operation portion; and maintaining constant the octupole component-activating potentials applied to the pole elements of this at least one multipole unit.

Another method of correcting aberrations in a charged-particle beam instrument in accordance with the present invention pertains to the charged-particle beam instrument having: an aberration corrector fitted with four stages of multipole units each having plural pole elements to which at least octupole component-activating potentials for correcting third-order aperture aberrations in a beam of charged particles are applied; an objective lens mounted on a rear side of the aberration corrector and acting to focus the accelerated beam of charged particles onto a specimen; a control portion for controlling the activation potentials applied to the pole elements of the stages of multipole units; and an operation portion for varying the accelerating voltage of the beam or the working distance between the objective lens and the specimen. Operating the control portion, the method further comprises the steps of: adjusting the resultant magnification of the aberration corrector and the objective lens when the accelerating voltage or working distance is varied by the operation portion; and setting the octupole component-activating potentials applied to the pole elements of at least one stage of the multipole units to a range from a maximum permissible output voltage value of a power supply for the octupole component-activating potentials to a value that is one-tenth of the maximum permissible output voltage value.

A charged-particle beam instrument according to the present invention has an aberration corrector fitted with four stages of multipole units each having plural pole elements to which at least octupole component-activating potentials for correcting third-order aperture aberrations in a beam of charged particles are applied; an objective lens mounted on a rear side of the aberration corrector and acting to focus the accelerated beam of charged particles onto a specimen; a control portion for controlling the activation potentials applied to the pole elements of plural stages of multipole units; and an operation portion for varying the accelerating voltage of the beam or the working distance between the objective lens and the specimen. Operating the control portion, when the accelerating voltage or working distance is varied by the operation portion, the control portion adjusts the resultant magnification of the aberration corrector and objective lens and maintains constant the octupole component-activating potentials applied to the pole elements of at least one stage of the multipole units.

Another charged-particle beam instrument according to the present invention has an aberration corrector fitted with four stages of multipole units each having plural pole elements to which at least octupole component-activating potentials for correcting third-order aperture aberrations in a beam of charged particles are applied; an objective lens mounted on a rear side of the aberration corrector and acting to focus the accelerated beam of charged particles onto a specimen; a control portion for controlling the activation potentials applied to the pole elements of the stages of multipole units; and an operation portion for varying the accelerating voltage of the beam or the working distance between the objective lens and the specimen. Operating the control portion, when the accelerating voltage or working distance is varied by the operation portion, the control portion adjusts the resultant magnification of the aberration corrector and objective lens and sets the octupole component-activating potentials applied to the pole elements of at least one stage of the multipole units to a range from a maximum permissible output voltage value of a power supply for the activation potentials to a value that is one-tenth of the maximum permissible output voltage value.

Other objects and features of the present invention will appear in the course of the description thereof, which follows.

DESCRIPTION OF THE PREFERRED EMBODIMENTS

Figure 5:
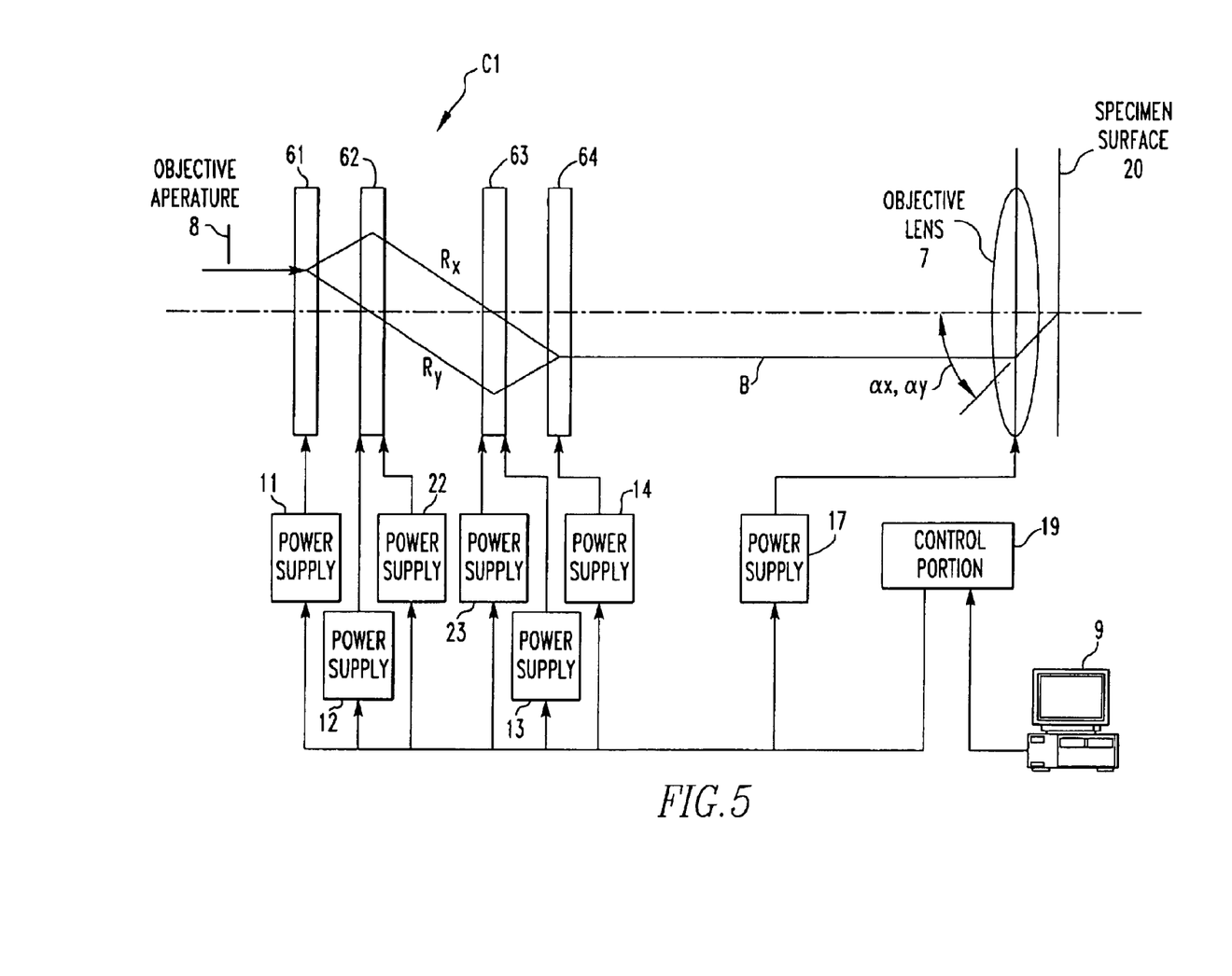
FIG. 5 is a diagram illustrating the fundamental structure of the present invention.

The preferred embodiments of the present invention are hereinafter described in detail with reference to the drawings. FIG. 5 shows the fundamental structure of the present invention. An instrument for directing a part of a beam of charged particles as a probe at a specimen is shown. The instrument is fitted with an aberration corrector C1 for correcting chromatic aberration in the same way as in the past. The corrector C1 is made up of four stages of multipole units (hereinafter may be referred to as the multipole elements) 61, 62, 63, and 64 acting as aberration correction units. Of these four stages of multipole elements 61–64, the two central stages of multipole elements 62 and 63 are designed to function as magnetic multipole elements capable of superimposing a magnetic potential distribution analogous to an electric potential distribution created by electrostatic multipole element-activating electric potentials on the electric potential distribution.

The first and fourth stages of multipole elements 61 and 64 each have twelve electrodes $U_n$ as shown in FIG. 2. The second and third stages of multipole elements 62 and 63 each have twelve magnets $W_n$ as shown in FIG. 3. Each of the magnets $W_n$ is made of a conductive magnetic material and can act also as an electrode. Adjacent coils excluding one within the magnet $W_n$ may be connected in series. This simplifies the circuit configuration including the power supply, reducing the cost. This leads to a noise decrease.

An objective lens 7 is disposed on the output side of the four stages of multipole elements 61–64 acting as the aberration corrector. A specimen surface 20 is positioned behind the objective lens 7. An objective aperture (aperture baffle) 8 is mounted in a part of the optical path on the input side of the four stages of multipole elements 61–64 operating as the aberration corrector.

Besides the components of the charged particle optics, there are provided an operation-and-display portion 9 for modifying the accelerating voltage or the working distance, a power supply 11 for supplying a voltage to the electrodes of the first stage of multipole element, a power supply 12 for supplying a voltage to the electrodes of the second stage of multipole elements, a power supply 13 for supplying a voltage to the electrodes of the third stage of multipole elements, and a power supply 14 for supplying a voltage to the electrodes of the fourth stage of multipole elements. In addition, there are provided excitation current sources 22 and 23 for supplying currents to the coils on the polepieces of the second and third stages of multipole elements 62 and 63.

Additionally, there are provided an excitation power supply 17 for the objective lens 7 and a control portion 19 for controlling the voltage power supplies 11–14 and excitation power supplies 22, 23, and 17 according to the operation or settings of the operation-and-display portion 9. The control portion 19 is operated by the operation-and-display portion 9.

In the instrument shown in FIG. 5, the power supplies 11–14 are constructed such that the four stages of multipole elements 61–64 can be operated at least as electrostatic dipole elements, electrostatic quadrupole components, electrostatic hexapole elements, and electrostatic octupole components. In each of these modes of operation, electric potentials for activation of the dipole elements, quadrupole components, hexapole elements, and octupole components are applied to the electrodes of the multipole elements 61–64 by the power supplies 11–14, respectively, under control of the control portion 19. The power supplies 11–14 have functions of supplying the activation potentials that cause the multipole elements 61–64 to be used as dipole elements for normal and skew uses, as quadrupole components for normal and skew uses, and as hexapole elements for normal and skew uses.

Where the objective lens 7 is of the magnetic type, the strength of the lens is adjusted by varying the current supplied from the power supply 17. Where the objective lens 7 is of the electrostatic type, the lens strength is adjusted by varying the voltage supplied from the power supply 17. Where the objective lens 7 is of the electric field/magnetic field superimposed type, the lens strength is adjusted by adjusting the current and voltage supplied from the power supply 17. Furthermore, where the charged particles are high-speed ions, the objective lens 7 is of the electrostatic type that produces the same refractive force irrespective of the mass of each charged particle. In the following description, the four stages of multipole elements 1–4 and their power supplies are collectively referred to as the aberration correction system.

Figure 6:
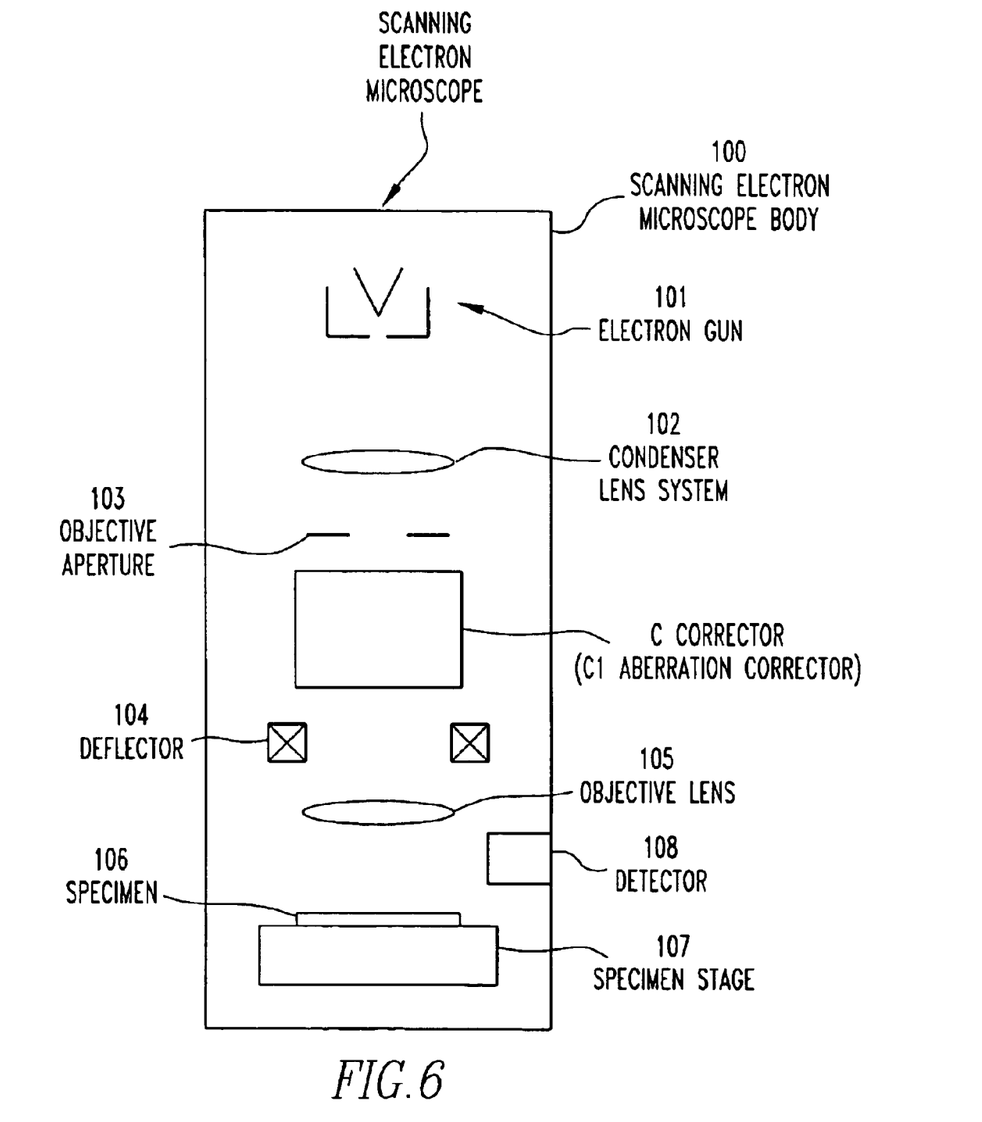
FIG. 6 is a diagram illustrating a scanning electron microscope fitted with an aberration correction system C.

In this aberration correction system, the aberration corrector C1 fitted with the four stages of multipole elements 61–64 is incorporated, for example, in a scanning electron microscope as shown in FIG. 6. The inside of the body 100 of an electron microscope is maintained as a vacuum ambient. An electron gun 101, a condenser lens system 102, an objective aperture 103, the aberration corrector C1, a deflector 104, an objective lens 105, a specimen stage 107 on which a specimen 106 is placed, a detector 108, and other components are mounted in the body 100 of the microscope. The electron gun 101 imparts energy to electrons by an accelerating voltage to thereby produce an electron beam. The condenser lens system 102 and objective aperture 103 focus the electron beam produced by the electron gun 101, and limit the electron beam current and the aperture of the beam to appropriate values respectively. The deflector 104 is used to deflect and scan the beam in two dimensions. The objective lens 105 focuses the beam onto the specimen 106. The specimen stage 107 can move the specimen 106 at will such that a desired portion of the specimen is illuminated and scanned by the beam. As the specimen is illuminated and scanned with the beam, secondary electrons or other signals are produced from the specimen 106. The secondary electrons are detected by the detector 108. Where the specimen 106 is conductive, an electric potential for decelerating the electron probe (particle probe) is applied to the specimen 106. As a result, the aberration coefficient of the objective lens 105 can be reduced. The part from the electron gun 101 to the surface of the specimen 106 may be referred to as the electron beam optics.

The operation of the structure described so far is described. Let $\alpha_x$ and $\alpha_y$ be the aperture angles of the charged-particle beam B incident on the specimen surface 20 in the X- and Y-directions, respectively. Third-order aperture aberration coefficients observed on the specimen surface 20 include $C_{30}$ and $C_{12}$ in the X-direction and $C_{21}$ and $C_{03}$ in the Y-direction. The coefficients $C_{30}$ and $C_{12}$ are in proportion to $\alpha_x^3$ and $\alpha_x\alpha_y^2$. The coefficients $C_{21}$ and $C_{03}$ are in proportion to $\alpha_x^2\alpha_y$ and $\alpha_y^3$. As general formulas, the third-order X- and Y-direction aperture aberrations ΔX and ΔY are given by $$\Delta X = C_{30,x}\alpha_x^3 + C_{21,x}\alpha_x^2\alpha_y + C_{12,x}\alpha_x\alpha_y^2 + C_{03,x}\alpha_y^3$$

$$\Delta Y = C_{30,y}\alpha_x^3 + C_{21,y}\alpha_x^2\alpha_y + C_{12,y}\alpha_x\alpha_y^2 + C_{03,y}\alpha_y^3$$

If the second-order aperture aberrations have been corrected, and if there are no skew octupole components, we have $$C_{21,x} = C_{03,x} = 0$$

$$C_{30,y} = C_{12,y} = 0$$

Where the effect of the beam rotation is eliminated.

To simplify the following description of the operating principle, the X-direction of the reference orbit is selected and the proportional coefficient $C_{30}$ of $\alpha_x^3$ is taken as an example. The operating principle is the same for the other coefficients.

In the aberration correction system, when potentials $\phi_{01}$, $\phi_{02}$, $\phi_{03}$, and $\phi_{04}$ (potentials applied to the multipole elements such that the multipole elements 61–64 act as octupole components) at the electrostatic multipole elements for correction of the third-order aperture aberrations are all zero, i.e., when the third-order aperture aberrations are not corrected, as for the whole lens system, the aberration coefficient $C^0{}_{30,S}$ formed at the specimen surface is a function of the X-direction magnification $M_{4,X}$ owing to the electrostatic quadrupole component of the multipole element 4 in the fourth stage and the X-direction magnification $M_{OL}$ owing to the objective lens 7, i.e., $$C^0{}_{30,S} = C^0{}_{30,S}(M_{4,X}, M_{OL})$$

This coefficient includes all third-order aperture aberration coefficients of the lens system such as spherical aberration coefficient $C_s$ of the objective lens 7 to be corrected and the spherical aberration coefficient of the condenser lens system placed ahead of the aberration correction system. Normally, variations in the spherical aberration coefficient of the condenser lens system due to a change in the probe current and variations in the third-order aperture aberration coefficients of the aberration correction system are sufficiently smaller than the spherical aberration coefficient of the objective lens 7.

In the aberration corrector C1, when the electrostatic octupole component potentials $\phi_{01}$, $\phi_{02}$, $\phi_{03}$, and $\phi_{04}$ for correction of the third-order aperture aberrations are applied to the electrodes of the four stages of multipole elements 61–64, the third-order aperture aberration coefficient of the term proportional to $\alpha_x^3$ for correction of the aberration created in the center of the multipole element 3 in the third stage is given by $$C^C{}_{30,0}$$

If not affected by the aberrations of the optics in the following stages, the aberration coefficient assumes a value given by $$C^C{}_{30,0} \cdot (M_{4,X} M_{OL})^4$$

on the specimen surface 20. Accordingly, in order to correct the third-order aperture aberrations, it is necessary that the following relation be satisfied on the specimen surface:

$$C^0{}_{30,S} + C^C{}_{30,0} \cdot (M_{4,X} M_{OL})^4 = 0 \quad (1)$$

According to the normal concept, one method of satisfying this condition is to adjust the $C^C{}_{30,0}$ by varying the electrostatic octupole component potentials $\phi_{01}$, $\phi_{02}$, $\phi_{03}$, and $\phi_{04}$ (potentials for activating the octupole components) while maintaining constant the $C^0{}_{30,S}$, $M_{4,X}$, and $M_{OL}$.

However, $C^0{}_{30,S}$ may vary if $M_{4,X}$ and $M_{OL}$ are varied. It is considered that the above-described condition can also be accomplished by adjusting the resultant magnification $M_{4,X}$ and $M_{OL}$. For example, in a case where the condition $$\phi_{02} = \text{constant}$$

is retained when the accelerating voltage or working distance is varied at the potential $\phi_{02}$ at the electrostatic octupole component of the second stage of multipole elements mainly affecting the X-direction aberration coefficient, our simulation has confirmed that Eq. (1) holds if the resultant component $M_{4,X} \cdot M_{OL}$ is mainly adjusted. Similar concepts can be applied to the Y-direction.

Furthermore, in correction of the third-order aperture aberrations, in a case where skew multipole components can be neglected, three independent potentials are necessary for correction of the third-order aperture aberrations out of the four potentials $\phi_{01}$, $\phi_{02}$, $\phi_{03}$, and $\phi_{04}$ applied to the four stages of multipole elements 61–64 to activate the octupole components. Therefore, when the accelerating voltage or working distance is varied, if the condition $$\phi_{01} = \phi_{04} = \text{constant}$$

is maintained, it can similarly be confirmed that Eq. (1) holds by mainly adjusting the resultant magnification $M_{4,X} \cdot M_{OL}$ and $M_{4,Y} \cdot M_{OL}$ of the X- and Y-direction magnification $M_{4,X}$ and $M_{4,Y}$ owing to the electrostatic quadrupole component of the multipole element 4 in the fourth stage and the magnification $M_{OL}$ of the objective lens 7.

Similar consideration can be applied to the Y-direction. However, in the Y-direction, the Y-direction magnification $M_{3,Y}$ of the multipole element in the third stage is associated, in addition to the Y-direction magnification $M_{4,Y}$ of the multipole element in the fourth stage.

In the above description, the expression "the resultant magnification of the multipole element 4 in the fourth stage and objective lens 7" is used. In practice, this corresponds, for example, to the method of varying the focal length $f_{OL}$ of the objective lens 7 and varying the focusing potentials (mainly the focusing potential $\phi_{qf4}$ owing to the electrostatic quadrupole component of the multipole element in the fourth stage) at the four stages of multipole elements 61–64 such that the reference orbit is obtained.

In this way, the resultant magnification of the aberration corrector C1 and objective lens 7 is adjusted. With respect to at least one stage of multipole element of the four stages of multipole elements 61–64 forming the corrector C1, the octupole component-activating potential applied to the multipole element can be kept constant. That is, when the accelerating voltage of the electron beam or the working distance is varied, the resultant magnification of the aberration corrector and objective lens can be adjusted. Also, with respect to at least one stage of multipole unit, the potential applied to the pole elements of the multipole unit to activate the octupole components can be maintained constant. In this case, this potential (target value) for activating the octupole components is held at least within ±10% of the initially set value of the potential, i.e., value set before the accelerating voltage of the beam or the working distance is varied. This also means that in a case described later, the potential or current (target value) is retained at least within ±10% of the initially set value if the potential or current should be kept constant. In actual instrumentation, when the correction is fully completed, the range in which the potential or current is retained may exceed ±10% of the initially set value because of variations among individual instruments. However, it is sufficiently useful to try to hold the range of the potential or current (target value) at least within ±10% of the initially set value.

In the above embodiment, correction of chromatic aberration is not taken into consideration. In the description provided so far, only the resultant magnification of the magnification by the electrostatic quadrupole component of the multipole element in the fourth stage and the magnification by the objective lens 7 is chiefly taken into account in correction of the third-order aperture aberrations. Similar concepts can be applied to the case where chromatic aberration is corrected.

In the following second embodiment, when chromatic and spherical aberrations are corrected, with respect to at least one stage of multipole element, the potentials applied to the pole elements of the multipole element to activate the octupole components are kept constant. A procedure of finding calculated values in this second embodiment is described below. The found calculated values are used as initial values that maintain constant the potentials for activating the octupole components.

The initial setting is first described. It is assumed that magnetic excitations $J_2$ and $J_3$ of the magnetic quadrupole components of the second and third stages of multipole elements 2 and 3 for correction of chromatic aberrations and the chromatic aberration-correcting electric potentials $\phi_{qc2}$ and $\phi_{qc3}$ of the electrostatic quadrupole components of the second and third stages of multipole elements 2 and 3 for maintaining constant the reference orbit when those excitations are given are all zeros, i.e., correction of chromatic aberrations is not made. At this time, the X-direction chromatic aberration coefficient $C_x$ formed on the specimen surface by the whole lens system is mainly a function of the X-direction magnification $M_{4,X}$ of the multipole element 4 in the fourth stage and the magnification $M_{OL}$ of the objective lens 7, i.e., $$C_x = C_x(M_{4,X}, M_{OL})$$

Under this condition, the X- and Y-direction magnifications $M_{4,X}$ and $M_{4,Y}$ of the multipole element 4 in the fourth stage and the magnification $M_{OL}$ of the objective lens 7 are found to correct the third-order aperture aberrations by the above-described method of correcting the third-order aperture aberrations. In this case, the condition that the potential of the octupole components of at least one multipole element of interest is kept constant. One example of this multipole element of interest is the multipole element 2 in the second stage. Another example is a combination of the first and fourth stages of multipole elements 1 and 4.

Under the conditions of the resultant magnification set in this way in the initial phase, the magnetic excitations $J_2$ and $J_3$ for correcting chromatic aberrations, chromatic aberration-correcting potentials, and chromatic aberration potentials $\phi_{qc2}$ and $\phi_{qc3}$ are applied such that the reference orbit remains unchanged. In this state, chromatic aberrations are corrected. Under these conditions, the X-direction chromatic aberration coefficient $C_{OX}$ used for aberration correction and created in the center of the field-superimposed quadrupole element of the third stage of multipole element 3 becomes $$C_{OX} \cdot (M_{4,X} M_{OL})^2$$

on the specimen surface 20 if aberrations in the rear stage of optics do not affect this system.

Accordingly, in order that the X-direction chromatic aberration coefficient be corrected, the chromatic aberration-correcting magnetic excitations $J_2$, $J_3$, chromatic aberration-correcting potentials, and chromatic aberration potentials should be adjusted such that the X-direction chromatic aberration coefficient $C_{ox}$ satisfies the following equation.

$$C_X + CO_X \cdot (M_{4,X} M_{OL})^2 = 0$$

In the above equation, the first term of the left side is the chromatic aberration coefficient in the initial state in which no chromatic aberrations are made and the second term is the chromatic aberration coefficient when the magnetic excitations and potentials for correction of the chromatic aberrations are applied.

Correction of the third-order aperture aberrations is described now. If the resultant magnification $M_{4,X} M_{OL}$ is constant, the third-order aperture aberration coefficient $C^0_{30,S}$ varies when chromatic aberration correction is made. Accordingly, in this turn, correction of the third-order aperture aberrations is made while the chromatic aberration-correcting magnetic excitations $J_2$, $J_3$, chromatic aberration-correcting potentials, and chromatic aberration-correcting electric potentials $\phi_{qc2}$ and $\phi_{qc3}$ are applied. Of course, at this time, the potentials for correcting the third-order aperture aberrations are different from the target, given corrective potential. Accordingly, the reference orbit is varied by the method described in the first embodiment such that the voltages for correcting the third-order aperture aberrations reach the target value. That is, the X- and Y-direction magnifications $M_{4,X}$ and $M_{4,Y}$ of the fourth stage of multipole element 4 and the magnification $M_{OL}$ of the objective lens 7 are found so that the potentials of the octupole components of at least one multipole element of interest are kept constant. Of course, varying the reference orbit (accordingly, the resultant magnification) causes the chromatic aberration-correcting potential to deviate from its optimum value.

Then, a repetitive setting operation is described. The aforementioned chromatic aberration correction of the given resultant magnification and the aforementioned third-order aperture aberration correction for maintaining constant the octupole component potentials of at least one multipole element of interest are repeated alternately. Finally, various values that satisfy the following three conditions can be found if the accelerating voltage or working distance varies.

The first condition is that the potential at the octupole component of at least one multipole element of interest is constant. The second condition is that chromatic aberrations have been corrected. The third condition is that spherical aberration has been corrected. Various values which satisfy the three conditions simultaneously are as follows:

1. Magnification $M_{OL}$ (or focal distance $f_{OL}$) of the objective lens;
2. Magnifications $M_{4,X}$ and $M_{4,Y}$ when the quadrupole component of the fourth stage of multipole element (potential for activating the quadrupole element) is applied (or mainly focusing potential $\phi_{qf4}$ of the quadrupole component (with respect to the Y-direction, the magnification $M_{3,Y}$ when the potential for activating the third stage of quadrupole element is also associated));
3. Chromatic aberration-correcting magnetic excitations $J_2$, $J_3$, chromatic aberration-correcting potentials, and chromatic aberration-correcting electric potentials $\phi_{qc2}$ and $\phi_{qc3}$; and
4. Third-order aperture aberration-correcting potentials $\phi_{01}$, $\phi_{02}$, $\phi_{03}$, and $\phi_{04}$.

The values found by the aforementioned initial setting, chromatic aberration correction, third-order aperture aberration correction, and repetitive setting can be used as a data table providing initial values when the accelerating voltage or working distance is varied. Because of this configuration, if the operating conditions are varied, the reference corrective conditions providing a measure are kept constant under some conditions. Therefore, the controllability is improved.

Figure 7:
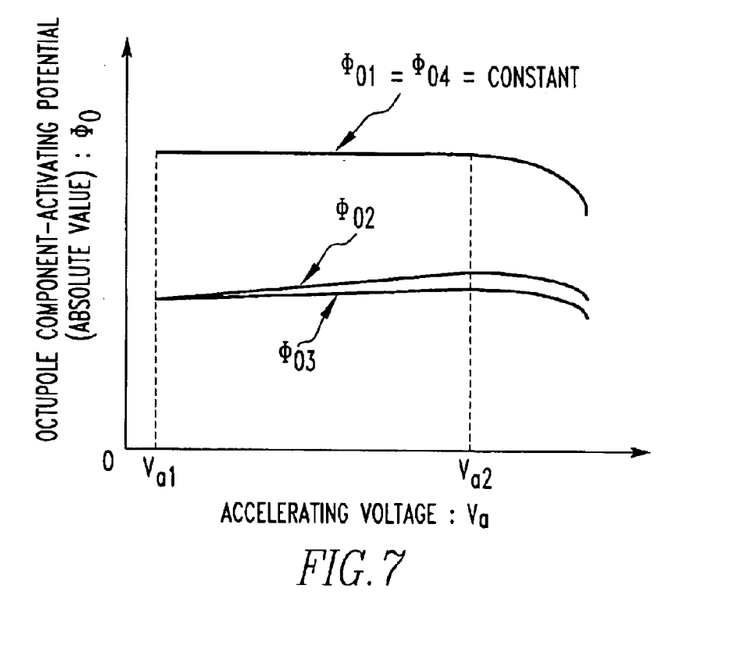
FIG. 7 is a graph showing the relation between accelerating voltage and the absolute value of aberration-correcting voltage.

An example is given in which when the accelerating voltage is changed, chromatic aberration and third-order aperture aberration are both corrected. In addition, the potentials $\phi_{01}$, $\phi_{02}$, $\phi_{03}$, and $\phi_{04}$ of the octupole components of the four stages of multipole elements 61–64 are controlled in such a way that the condition $\phi_{01} = \phi_{04}$ = constant is satisfied. The potential or current of the power supply for correction of chromatic aberrations suffices up to the accelerating voltages $V_{a1}$ to $V_{a2}$, and the condition $\phi_{o1}=\phi_{o4}$= constant is met. The relation between the accelerating voltage $V_a$ varied in this way and the third-order aperture aberration-correcting potential varying concomitantly is shown in FIG. 7.

On the other hand, in this example, when the accelerating voltage is in excess of $V_{a2}$, the voltage or current of the power supply for correction of chromatic aberration is insufficient and so the magnification of the lens system (mainly, the resultant magnification of the fourth stage of multipole element 64 and the objective lens 7) is increased. As a result, the potential of the octupole component cannot be maintained constant. However, the target voltage for aberration correction is close to a constant value and is easy to see. Consequently, the controllability is enhanced.

Figure 8:
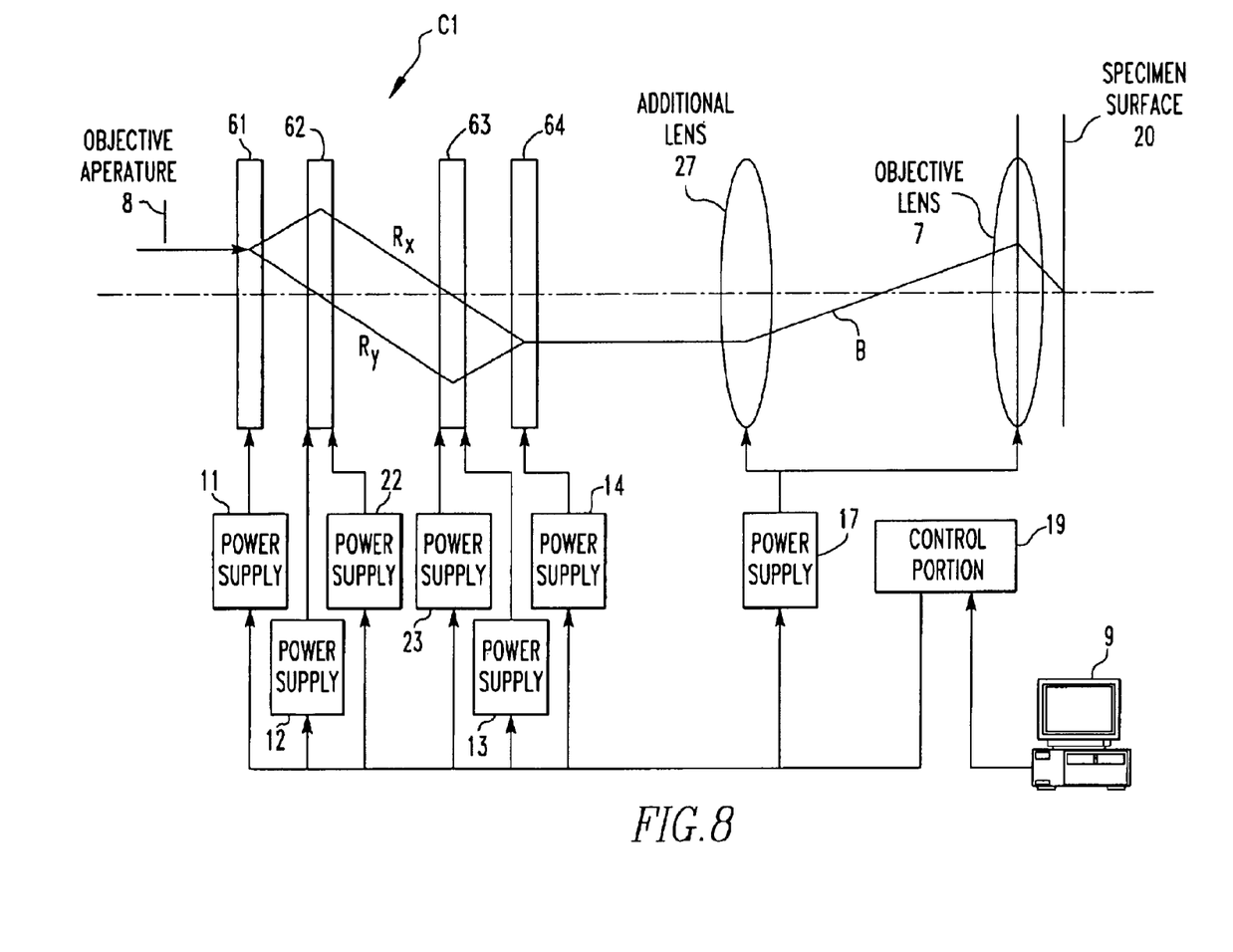
FIG. 8 is a diagram showing the fundamental structure of another embodiment of the present invention.

Another embodiment of the present invention is shown in FIG. 8. In the embodiment described so far, when the accelerating voltage or working distance is varied, the resultant magnification of the lens magnification owing to the quadrupole component of the fourth stage of multipole element 64 and the objective lens 7 is varied. Thus, the chromatic aberration and third-order aperture aberrations are corrected without greatly changing the amount of aberration correction produced by the aberration correction system.

Accordingly, if the lens magnification owing to the quadrupole component of the fourth stage of multipole element 64 is varied, the reference orbit varies. Therefore, the ratio between the X- and Y-direction lens magnifications changes. This limits the potentials at the multipole elements capable of being retained at a constant potential for activating the octupole component to a certain one of the three independent potentials for correcting the third-order aperture aberrations.

The chromatic aberration and third-order aperture aberrations can be corrected without varying the reference orbit within the aberration correction system by positioning at least one additional lens 27 between the aberration correction system C and objective lens 7 and adjusting the resultant magnification $M_A M_{OL}$ of the magnification $M_A$ of the additional lens 27 and magnification $M_{OL}$ of the objective lens 7.

Because of the use of this configuration, the X- and Y-direction magnifications need to be less varied. When the accelerating voltage or working distance is varied, the potentials for correcting three independent third-order aperture aberrations can all be maintained constant. Consequently, the chromatic and third-order aperture aberrations can be corrected while maintaining constant all the potentials for activating the octupole components of the four stages of multipole elements.

In the above embodiments, with respect to at least one stage of multipole elements of the four stages of multipole units, the potentials applied to the pole elements of the multipole elements to activate the octupoles are maintained constant. Instead, each of the first and fourth stages of multipole elements may be fitted with twelve magnets $W_n$ shown in FIG. 3. With respect to at least one of stage of multipole elements of the four stages, the currents supplied to the coils of the multipole elements to activate the octupole components may be kept constant.

In the control provided in the embodiments described so far, when the accelerating voltage or working distance is varied, variations in the potentials or currents for activating the octupole components for correcting the third-order aperture aberrations are prevented from becoming complex by varying the resultant magnification of the system ranging from the aberration corrector C1 to the objective lens 7. For this purpose, with respect to at least one stage of multipole elements, the potentials applied to the pole elements of the multipole elements or the currents supplied to the coils of the multipole elements to activate the octupole components are kept as constant as possible.

It is to be noted, however, that the present invention is not limited to this embodiment. In a modified embodiment of the present invention, the following control is provided. When the accelerating voltage or working distance is varied, if the potentials or currents for activating the octupole components for achieving other objects are varied complexly, the power supply voltage or power supply current of the aberration correction system C2 is retained within a given range by varying the above-described resultant magnification. In this way, the above-described advantages can be obtained. This control is described further below.

Let $\Phi_{om}$ be the maximum permissible output voltage of the power supply voltage (or let $I_{om}$ be the maximum permissible output current of the power supply current). Let $\Phi_o$ be the currently used voltage component for activating the octupole component (or let $I_o$ be the current component for activating the octupole component). Let $\Delta\Phi_o$ be the fluctuating voltage component due to noise or ripple component of the power supply (or let $\Delta I_o$ be the fluctuating current component). Since the degree of the fluctuating component of the currently used potential for activating the octupole component or current exciting the octupole component is given by $\Delta\Phi_o/\Phi_o$ (or $\Delta I_o/I_o$), it is advantageous to increase the output voltage $\Phi_o$ or output current $I_o$.

Since the fluctuating voltage component $\Delta\Phi_o$ or fluctuating current component $\Delta I_o$ has its lower limit, it is preferable that the voltage component $\Phi_o$ is from $\Phi_{om}$ to $\Phi_{om}/10$ or the current component $I_o$ is from $I_{om}$ to $I_{om}/10$ even if the instrument has a ratio k ($=V_{a,min}/V_{a,max}$) less than 0.1 for the maximum and minimum accelerating voltages $V_{a,max}$ and $V_{a,min}$, respectively. That is, if the variable range of $\Phi_o$ or $I_o$ exceeds the above range, more stringent requirements are imposed on the stability of the power supply. This makes the power supply more expensive.

Figure 9:
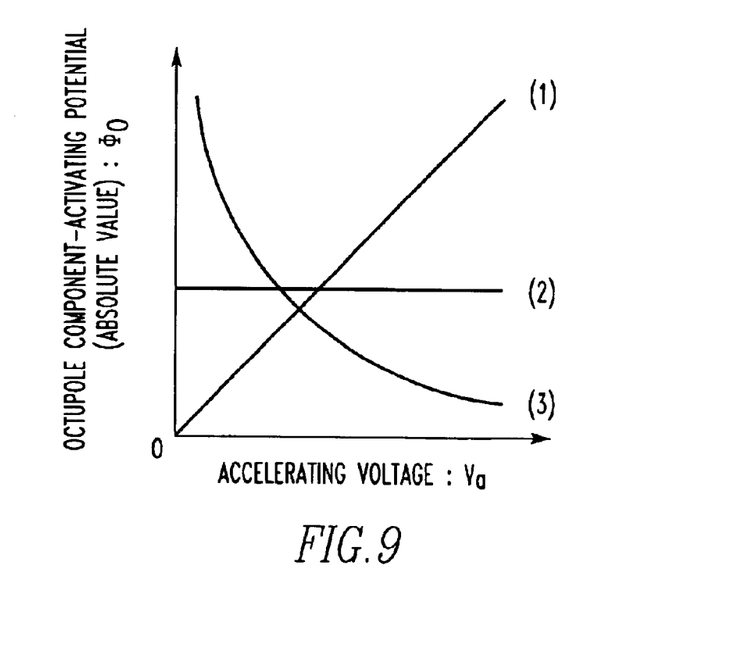
FIG. 9 is a graph showing some examples of controlling the absolute value of aberration-correcting voltage relative to accelerating voltage.

Some examples in this case are described. Three typical methods of control are shown in FIG. 9. That is, in case (1), the potential applied to the pole elements of the multipole elements of the aberration corrector is made proportional to the accelerating voltage $V_a$ to activate the octupole components such that the magnification of the aberration corrector is not affected by the accelerating voltage $V_a$ of the electron beam. In case (2), the magnification is varied such that the potential for activating the octupole components is kept constant when the accelerating voltage $V_a$ of the electron beam is increased. This corresponds to the above-described embodiments. In case (3), at high values of the accelerating voltage $V_a$, the potentials for activating the octupole components are kept low by increasing the magnification with increasing the accelerating voltage $V_a$, e.g., by maintaining constant the current of the power supply for correction of chromatic aberration.

Figure 10:
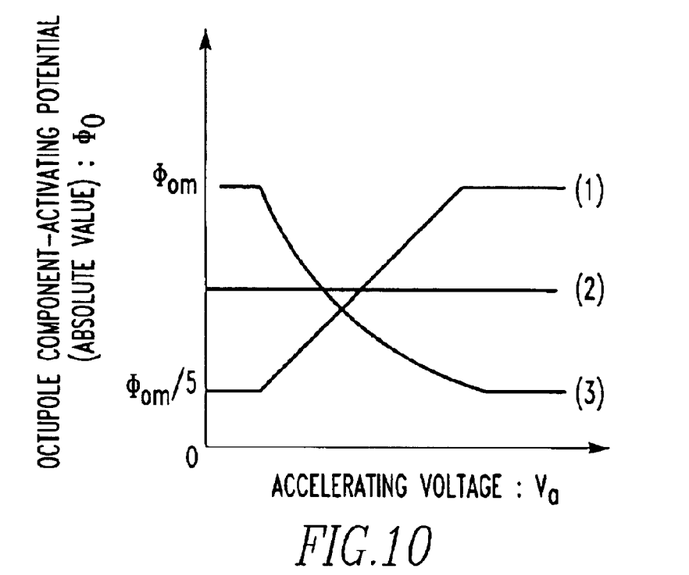
FIGS. 10 and 11 are graphs showing the relation between accelerating voltage and the absolute value of aberration-correcting voltage in a modified embodiment of the invention.

Even in cases (1) and (3) of these three cases, control can be provided by varying the above-described resultant magnification such that the lower limit of the output voltage is $\Phi_{om}/5$ when the maximum permissible output voltage of the power supply is $I_{om}$. This example is illustrated in FIG. 10. The range of the power supply voltage can be limited by adjusting the resultant magnification in this way. An aberration correction system that operates stably can be accomplished at low cost.

Figure 11:
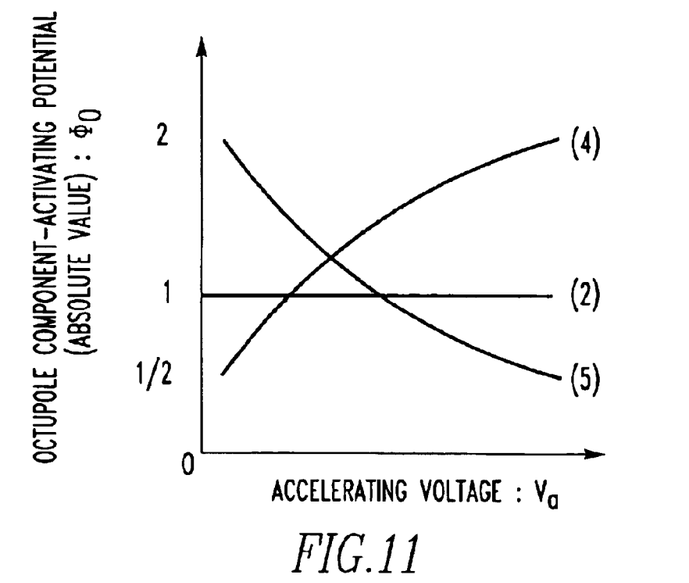

Other control methods of the present invention are shown in FIG. 11. The curve (4) shows the example of the control methods that the spherical aberration-correcting octupole potential is half at minimum accelerating voltage and is twice at maximum accelerating voltage increasing the lens magnification for the lower accelerating voltage to decrease the effect of higher order aberration coefficients.

The curve (5) shows the example of the control methods that the spherical aberration-correcting octupole potential is twice at minimum accelerating voltage and is half at maximum accelerating voltage decreasing the lens magnification for the lower accelerating voltage to decrease the effect of noise of the power supplies.

Also, where plural power supplies are switchably connected to widen the range of the applied voltage, a similar method of control can be applied.

The concept of control described above, i.e., control is provided such that at least one of the potentials for activating octupole components is kept at a constant value to correct the third-order aperture aberrations in a case where the accelerating voltage or working distance is varied or control is provided such that the potentials for activating the octupole components are kept within given ranges for the same purpose, can be applied to other examples. That is, when fifth- or seventh-order aperture aberration is corrected, if control is provided such that a corrective voltage for any one of them is kept constant, the potentials for correcting the third-order aperture aberrations may be held within a given range.

As described so far, one embodiment of the present invention provides a method of correcting aberrations in a charged-particle beam instrument having: four stages of multipole units; an objective lens for focusing a beam of charged particles onto a specimen; an objective aperture mounted in a part of an optical path for the beam of charged particles; an operation portion for varying the accelerating voltage of the beam or the working distance between the objective lens and the specimen; and a control portion for controlling the multipole units according to operation or setting of the operation portion. The method comprises the steps of: adjusting the resultant magnification of the four stages of multipole units and objective lens mounted behind the four stages of multipole units; and maintaining constant at least one of octupole component-activating potentials for correcting third-order aperture aberrations.

As a result, the voltages for correcting the third-order aperture aberrations are prevented from decreasing extremely at low accelerating voltages; such extreme decreases would be produced when the resultant magnification was not varied. Furthermore, the voltages for correcting the third-order aperture aberrations are prevented from increasing extremely at low accelerating voltages; such extreme increases would be produced when the resultant magnification was varied greatly. Since the corrected potential that is a target is kept constant irrespective of modifications of the operating conditions, the controllability can be improved.

Furthermore, when the accelerating voltage or working distance is varied, the resultant magnification of the four stages of multipole units and objective lens is adjusted. In addition, the chromatic aberration-correcting potential of the aberration correction system is adjusted. Therefore, the aforementioned advantages can be obtained if chromatic and third-order aperture aberration coefficients are made zero.

Moreover, when the accelerating voltage of the charged-particle beam or working distance is varied within a given range, correcting potentials applied to the first and fourth stages of multipole units out of the potentials for activating the four octupole components to correct the third-order aperture aberrations are kept constant and so the controllability is enhanced more conspicuously.

When the accelerating voltage of the charged-particle beam or working distance is varied within a given range, the potentials for activating the four octupole components for activating the third-order aperture aberrations are maintained constant. Therefore, the controllability can be enhanced more conspicuously.

In a charged-particle beam instrument according to the present invention, at least one additional lens is disposed between an aberration corrector and an objective lens. When the accelerating voltage or working distance is varied, the resultant magnification of the additional lens and objective lens is adjusted according to an instruction from an operation portion. This reduces deviations of X- and Y-direction magnifications caused by adjustment of the magnification of the aberration correction system. Because of this structure, all of the potentials for activating the octupole components for correcting the third-order aperture aberrations can be kept constant.

In addition, it is unlikely that the voltages for correcting the third-order aperture aberrations decrease extremely at low accelerating voltages as in cases where the resultant magnification is not varied. Furthermore, it is unlikely that the voltages for correcting the third-order aperture aberrations increase extremely at low accelerating voltages as in cases where the resultant magnification is varied greatly. Further, the controllability can be improved because the corrected potentials that are targets are kept constant irrespective of variations in the operating conditions.

In a charged-particle beam instrument according to the present invention, at least one additional lens is disposed between an aberration corrector and an objective lens. When the accelerating voltage or working distance is varied, the chromatic aberration-correcting potentials of the aberration corrector and the resultant magnification of the additional lens and objective lens are adjusted according to an instruction from the operation portion. This reduces deviations of the X- and Y-direction magnifications caused by the adjustment of the magnification of the aberration corrector. Consequently, the potentials for activating the octupole components for correcting the third-order aperture aberrations can all be kept constant.

Additionally, if the chromatic and third-order aperture aberration coefficients are both corrected to 0, it is unlikely that the voltages for correcting the third-order aperture aberrations decrease extremely at low accelerating voltages as in cases where the resultant magnification is not varied. Furthermore, it is unlikely that the voltages for correcting the third-order aperture aberrations increase extremely at low accelerating voltages as in cases where the resultant magnification is varied greatly. Since the correcting potentials that are targets are kept constant regardless of variations in the operating conditions, the controllability can be improved.

Having thus described our invention with the detail and particularity required by the Patent Laws, what is desired protected by Letters Patent is set forth in the following claims.

What is claimed is:

1. A method of correcting aberrations in a charged-particle beam instrument having:
   an aberration corrector fitted with four stages of multipole units each having plural pole elements to which at least octupole component-activating potentials for correcting third-order aperture aberrations in a beam of charged particles are applied;

an objective lens mounted on a rear side of the aberration corrector and acting to focus the accelerated beam of charged particles onto a specimen;

a control portion for controlling the activation potentials applied to the pole elements of the stages of multipole units; and an operation portion for varying one of an accelerating voltage of the beam and a working distance that is a distance between the objective lens and the specimen;

operating the control portion, said method further comprising the steps of:

adjusting a resultant magnification of the aberration corrector and the objective lens when one of the accelerating voltage and the working distance is varied by the operation portion; and maintaining constant the octupole component-activating potentials applied to the pole elements of at least one stage of the multipole units.

2. A method of correcting aberrations in a charged-particle beam instrument as set forth in claim 1, wherein when one of the accelerating voltage and the working distance is varied, activation potentials applied to the pole elements of the stages of multipole units forming the aberration corrector for correcting chromatic aberration in the beam of charged particles are also adjusted.

3. A method of correcting aberrations in a charged-particle beam instrument as set forth in claim 1 or 2, wherein when one of the accelerating voltage and the working distance is varied, the activation potentials applied to the pole elements of the first and fourth stages of multipole elements to activate octupole components are maintained constant.

4. A method of correcting aberrations in a charged-particle beam instrument as set forth in claim 1 or 2, wherein when one of the accelerating voltage and the working distance is varied, the activation potentials applied to the pole elements of all of the four stages of multipole elements to activate octupole components are maintained constant.

5. A method of correcting aberrations in a charged-particle beam instrument having:

an aberration corrector fitted with four stages of multipole units each having plural pole elements to which at least octupole component-activating potentials for correcting third-order aperture aberrations in a beam of charged particles are applied;

an objective lens mounted on a rear side of the aberration corrector and acting to focus the accelerated beam of charged particles onto a specimen;

a control portion for controlling the activation potentials applied to the pole elements of the stages of multipole units; and an operation portion for varying one of an accelerating voltage of the beam and a working distance that is a distance between the objective lens and the specimen;

operating the control portion, said method further comprising the steps of:

adjusting a resultant magnification of the aberration corrector and the objective lens when the accelerating voltage or the working distance is varied by the operation portion; and setting the octupole component-activating potentials applied to the pole elements of at least one stage of the multipole units to a range from a maximum permissible output voltage value of a power supply for the octupole component-activating activation potentials to a value that is one-tenth of the maximum permissible output voltage value.

6. A charged-particle beam instrument comprising:

an aberration corrector fitted with four stages of multipole units each having plural pole elements to which at least octupole component-activating potentials for correcting third-order aperture aberrations in a beam of charged particles are applied;

an objective lens mounted on a rear side of the aberration corrector and acting to focus the accelerated beam of charged particles onto a specimen;

a control portion for controlling the activation potentials applied to the pole elements of the stages of multipole elements; and an operation portion for varying one of an accelerating voltage of the beam and a working distance that is a distance between the objective lens and the specimen, wherein when the accelerating voltage or working distance is varied by the operation portion, the control portion adjusts a resultant magnification of the aberration corrector and the objective lens and maintains constant octupole component-activating potentials applied to the pole elements of at least one stage of the multipole units.

7. The charged-particle beam instrument set forth in claim 6, wherein when one of said accelerating voltage and said working distance is varied, said control portion also adjusts activation potentials applied to the pole elements of the stages of multipole units forming the aberration corrector to correct chromatic aberration in the beam of charged particles.

8. The charged-particle beam instrument of claim 6 or 7, wherein when one of said accelerating voltage and said working distance is varied, said control portion maintains constant the potentials applied to the pole elements of the first and fourth stages of multipole units to activate the octupole components.

9. The charged-particle beam instrument set forth in claim 6 or 7, wherein when one of said accelerating voltage and said working distance is varied, said control portion maintains constant the potentials applied to the pole elements of all of the four stages of multipole units to activate the octupole components.

10. The charged-particle beam instrument set forth in claim 6 or 7, wherein at least one additional lens is disposed between said aberration corrector and said objective lens, and wherein when one of said accelerating voltage and said working distance is varied, the control portion adjusts a resultant magnification of the aberration corrector and the objective lens and maintains constant the octupole component-activating potentials applied to the pole elements of at least one stage of the multipole units.

11. The charged-particle beam instrument set forth in claim 6 or 7, wherein at least one additional lens is disposed between said aberration corrector and said objective lens, and wherein when one of said accelerating voltage and said working distance is varied, the control portion adjusts the activation potentials applied to the pole elements of the stages of multipole units forming the aberration corrector to correct chromatic aberration in the beam of charged particles, adjusts a resultant magnification of the additional lens and objective lens, and maintains constant the octupole component-activating potentials applied to the pole elements of at least one stage of the multipole units.

12. A charged-particle beam instrument comprising:

an aberration corrector fitted with four stages of multipole units each having plural pole elements to which at least octupole component-activating potentials for correcting third-order aperture aberrations in a beam of charged particles are applied;

an objective lens mounted on a rear side of the aberration corrector and acting to focus the accelerated beam of charged particles onto a specimen;

a control portion for controlling the activation potentials applied to the pole elements of the stages of multipole elements; and an operation portion for varying one of an accelerating voltage of the beam and a working distance that is a distance between the objective lens and the specimen, wherein when one of the accelerating voltage and the working distance is varied by the operation portion, the control portion adjusts a resultant magnification of the aberration corrector and the objective lens and sets octupole component-activating activation potentials applied to the pole elements of at least one stage of the multipole units to a range from a maximum permissible output voltage value of a power supply for the octupole component-activating potentials to a value that is one-tenth of the maximum permissible output voltage value.

13. The charged-particle beam instrument set forth in claim 12, wherein at least one additional lens is disposed between said aberration corrector and said objective lens, and wherein when one of said accelerating voltage and said working distance is varied, the control portion adjusts the resultant magnification of the additional lens and the objective lens and sets the octupole component-activating potentials applied to the pole elements of at least one stage of the multipole units to a range from a maximum permissible output voltage value of a power supply for the octupole component-activating potentials to a value that is one-tenth of the maximum permissible output voltage value.

14. The charged-particle beam instrument set forth in claim 12, wherein at least one additional lens is disposed between said aberration corrector and said objective lens, and wherein when one of said accelerating voltage and said working distance is varied, the control portion adjusts potentials applied to the pole elements of the stages of multipole units forming the aberration corrector to correct chromatic aberration in the beam of charged particles, adjusts a resultant magnification of the additional lens and the objective lens, and sets the octupole component-activating potentials applied to the pole elements of at least one stage of the multipole units to a range from a maximum permissible output voltage value of a power supply for the octupole component-activating potentials to a value that is one-tenth of the maximum permissible output voltage value.

* * * * *